United States Patent
Arima et al.

(10) Patent No.: US 10,692,916 B2
(45) Date of Patent: Jun. 23, 2020

(54) IMAGE-CAPTURING UNIT AND IMAGE-CAPTURING APPARATUS

(71) Applicant: NIKON CORPORATION, Tokyo (JP)

(72) Inventors: Hirofumi Arima, Tokyo (JP); Ryoichi Suganuma, Yokohama (JP); Ryuuzou Motoori, Kawasaki (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/193,760

(22) Filed: Jun. 27, 2016

(65) Prior Publication Data

US 2016/0307954 A1    Oct. 20, 2016

Related U.S. Application Data

(63) Continuation of application No. PCT/JP2014/084581, filed on Dec. 26, 2014.

(30) Foreign Application Priority Data

Dec. 27, 2013  (JP) ................................. 2013-272439

(51) Int. Cl.
*H01L 27/146* (2006.01)
*H04N 5/225* (2006.01)
(Continued)

(52) U.S. Cl.
CPC .... *H01L 27/14636* (2013.01); *G01R 31/3008* (2013.01); *H01L 27/14618* (2013.01);
(Continued)

(58) Field of Classification Search
CPC .................................................. H04N 5/2253
(Continued)

(56) References Cited

U.S. PATENT DOCUMENTS 4,918,521 A * 4/1990 Yabe ................... A61B 1/00179
348/373
7,046,293 B1 * 5/2006 Nagase ................... H02M 1/32
348/372

(Continued)

FOREIGN PATENT DOCUMENTS

JP    2001-166354 A    6/2001
JP    2001-223933 A    8/2001
(Continued)

OTHER PUBLICATIONS

Jun. 8, 2017 Search Report issued in European Patent Application No. 14874390.9.
(Continued)

*Primary Examiner* — Jefferey F Harold
*Assistant Examiner* — Justin B Sanders
(74) *Attorney, Agent, or Firm* — Oliff PLC

(57) ABSTRACT

An image-capturing unit includes; an image-capturing chip; a power supply circuit unit that outputs electrical power to be fed to the image-capturing chip; a power supply line that feeds electrical power from the power supply circuit unit to the image-capturing chip; a disconnecting unit that is provided to the power supply line and is electrically disconnecting the power supply circuit unit and the image-capturing chip when a leakage current of the image-capturing chip is measured; and an implementation substrate on which the power supply circuit unit, the image-capturing chip, the power supply line and the disconnecting unit are implemented.

23 Claims, 10 Drawing Sheets

(51) Int. Cl.
   *H04N 5/369* (2011.01)
   *G01R 31/30* (2006.01)
   *H04N 5/232* (2006.01)
   *H04N 5/361* (2011.01)
   *H04N 5/357* (2011.01)

(52) U.S. Cl.
   CPC ..... *H01L 27/14629* (2013.01); *H04N 5/2253* (2013.01); *H04N 5/23241* (2013.01); *H04N 5/23293* (2013.01); *H04N 5/357* (2013.01); *H04N 5/361* (2013.01); *H04N 5/3698* (2013.01); *H01L 2224/48091* (2013.01); *H01L 2924/13091* (2013.01); *H01L 2924/16195* (2013.01)

(58) Field of Classification Search
   USPC ......................................................... 348/187
   See application file for complete search history.

(56) References Cited

U.S. PATENT DOCUMENTS

| | | | |
|---|---|---|---|
| 2005/0212097 A1* | 9/2005 | Shih | H01L 23/49513 257/666 |
| 2007/0145981 A1 | 6/2007 | Tomita et al. | |
| 2008/0197703 A1* | 8/2008 | Tomita | G06F 1/3203 307/31 |
| 2010/0128154 A1* | 5/2010 | Xu | H04N 5/357 348/301 |
| 2012/0062775 A1 | 3/2012 | Shimizu | |
| 2012/0306533 A1* | 12/2012 | Ohmaru | H03K 19/17744 326/41 |
| 2013/0027566 A1* | 1/2013 | Solhusvik | H04N 1/00021 348/187 |
| 2013/0221470 A1* | 8/2013 | Kinsman | H01L 27/14618 257/434 |
| 2013/0222584 A1* | 8/2013 | Aoki | H04N 5/335 348/143 |
| 2014/0339668 A1 | 11/2014 | Arima et al. | |

FOREIGN PATENT DOCUMENTS

| | | |
|---|---|---|
| JP | 2006-238202 A | 9/2006 |
| JP | 2007-019423 A | 1/2007 |
| JP | 2010-81168 A | 4/2010 |
| JP | 2012-065032 A | 3/2012 |
| WO | 2013/118501 A1 | 8/2013 |
| WO | WO-2013118501 A1 * | 8/2013 ......... H01L 23/4006 |

OTHER PUBLICATIONS

Jul. 25, 2017 Office Action issued in Japanese Application No. 2015-555054.
Jul. 24, 2017 Office Action issued in Korean Application No. 10-2016-7020483.
Jun. 20, 2018 Office Action issued in European Patent Application No. 14 874 390.9.
May 29, 2018 Office Action issued in Korean Application No. 10-2016-7020483.
Sep. 10, 2018 Office Action issued in Chinese Application No. 201480075749.0.
Feb. 7, 2018 Office Action issued in Korean Application No. 10-2016-7020481.
Mar. 5, 2019 Office Action issued in Japanese Patent Application No. 2018-028264.
Apr. 12, 2019 Office Action issued in Chinese Patent Application No. 201480075749.0.
Jan. 31, 2019 Office Action issued in Indian Patent Application No. 201617025078.
Aug. 30, 2019 Office Action issued in Korean Patent Application No. 2016-7020483.
Sep. 24, 2019 Office Action issued in Japanese Patent Application No. 2018-028264.
Jan. 8, 2020 Office Action issued in Korean Patent Application No. 10-2018-7013227.

* cited by examiner

IMAGE-CAPTURING UNIT AND IMAGE-CAPTURING APPARATUS

The contents of the following Japanese patent application and PCT application are incorporated herein by reference:
NO. 2013-272439 filed on Dec. 27, 2013, and
NO. PCT/JP2014/084581 filed on Dec. 26, 2014.

BACKGROUND

1. Technical Field

The present invention relates to an image-capturing unit and an image-capturing apparatus.

2. Related Art

An image-capturing unit with a package structure in which an image-capturing chip is implemented within a ceramic package has been known.

PRIOR ART DOCUMENTS

Patent Documents

[Patent Document 1] Japanese Patent Application Publication No. 2007-019423

There has been an issue that a leakage current of an image-capturing chip cannot be measured highly precisely in a state where the image-capturing chip is implemented on an implementation substrate.

SUMMARY

According to a first aspect, an image-capturing unit comprises an image-capturing chip that captures an image of a subject The image-capturing unit may comprise an implementation substrate on which the image-capturing chip is implemented. The image-capturing unit may comprise an electronic component that is provided to the implementation substrate, and is for driving the image-capturing chip. The image-capturing unit may comprise a wiring that connects the electronic component and the image-capturing chip. The image-capturing unit may comprise an adjusting unit that is provided to the wiring, and adjusts an electrical current flowing from the electronic component to the image-capturing chip so that the electrical current becomes smaller when a leakage current of the image-capturing chip is being measured, as compared with when a leakage current of the image-capturing chip is not being measured.

The image-capturing chip may be arranged in a space formed by; a first surface of the implementation substrate; a frame that is arranged on the first surface, and surrounds at least a portion of the image-capturing chip; and a light-transmissive substrate arranged to face the image-capturing chip. The adjusting unit may be provided to a second surface that is opposite to the first surface in the implementation substrate.

The image-capturing unit may further comprise a first electrode that is connected to the wiring, and is to be used when a leakage current of the image-capturing chip is being measured. In the wiring, the adjusting unit is provided on the electronic component side relative to the first electrode.

The image-capturing unit may further comprise a resistor that is provided to the wiring, and is arranged to be connected in parallel with the adjusting unit. The image-capturing unit may further comprise a second electrode that is connected to the wiring, and is to be used when a leakage current of the image-capturing chip is being measured. The first electrode may be electrically connected to a first end portion of the resistor. The second electrode may be electrically connected to a second end portion of the resistor.

The adjusting unit may make higher an electrical resistance between the electronic component and the image-capturing chip when a leakage current of the image-capturing chip is being measured, as compared with when a leakage current of the image-capturing chip is not being measured.

The electronic component may have a power supply circuit unit that outputs an electrical power to be fed to the image-capturing chip.

The electronic component may have a voltage variation suppression circuit that suppresses temporal variation in voltage output by the power supply circuit unit.

The electronic component may have a discharge circuit that discharges electrical charges accumulated in the image-capturing chip.

According to a second aspect, an image-capturing apparatus may comprise any of the above-mentioned image-capturing units.

According to a third aspect, an image-capturing unit may comprise an image-capturing chip that captures an image of a subject. The image-capturing unit may comprise an implementation substrate on which the image-capturing chip is implemented. The image-capturing unit may comprise a power supply circuit unit that is provided to the implementation substrate, and outputs an electrical power to be fed to the image-capturing chip. The image-capturing unit may comprise a feed line that feeds the electrical power from the power supply circuit unit to the image-capturing chip. The image-capturing unit may comprise a restricting unit that is provided to the feed line, and restricts an electrical current flowing from the power supply circuit unit to the image-capturing chip when a leakage current of the image-capturing chip is measured.

The image-capturing chip may be arranged in a space formed by: a first surface of the implementation substrate; a frame that is arranged on the first surface, and surrounds at least a portion of the image-capturing chip; and a light-transmissive substrate arranged to face the image-capturing chip. The restricting unit may be provided to a second surface that is opposite to the first surface in the implementation substrate.

The image-capturing unit may further comprise a first electrode that is connected to a wiring connecting an electronic component for driving the image-capturing chip and the image-capturing chip, and is to be used when a leakage current of the image-capturing chip is being measured. In the wiring, the restricting unit may be provided on the electronic component side relative to the first electrode.

The image-capturing unit may further comprise a resistor that is provided to the wiring, and is arranged to be connected in parallel with the restricting unit. The image-capturing unit may further comprise a second electrode that is connected to the wiring, and is to be used when a leakage current of the image-capturing chip is being measured. The first electrode may be electrically connected to a first end portion of the resistor. The second electrode may be electrically connected to a second end portion of the resistor.

The restricting unit may make higher an electrical resistance between an electronic component for driving the image-capturing chip and the image-capturing chip when a leakage current of the image-capturing chip is being measured, as compared with when a leakage current of the image-capturing chip is not being measured.

The image-capturing unit may further comprise an electronic component for driving the image-capturing chip. The electronic component may have a power supply circuit unit that outputs an electrical power to be fed to the image-capturing chip.

The electronic component may have a voltage variation suppression circuit that suppresses temporal variation in voltage output by the power supply circuit unit.

The electronic component may have a discharge circuit that discharges electrical charges accumulated in the image-capturing chip.

According to a fourth aspect, an image-capturing apparatus may comprise any of the above-mentioned image-capturing units.

According to a fifth aspect, a substrate may comprise an electronic component for driving an image-capturing chip. The substrate may comprise a wiring that connects the electronic component and the image-capturing chip. The substrate may comprise an adjusting unit that is provided to the wiring, and adjusts an electrical current flowing from the electronic component to the image-capturing chip so that electrical current becomes smaller when a leakage current of the image-capturing chip is being measured, as compared with when a leakage current of the image-capturing chip is not being measured.

The substrate may have a first surface on which the image-capturing chip is implemented. The substrate may have a second surface that is opposite to the first surface, wherein
The adjusting unit may be provided to the second surface.

According to a sixth aspect, a substrate may comprise an electronic component for driving an image-capturing chip. The substrate may comprise a wiring that connects the electronic component and the image-capturing chip. The substrate may comprise a restricting unit that is provided to the wiring, and restricts an electrical current flowing from the electronic component to the image-capturing chip when a leakage current of the image-capturing chip is being measured.

The substrate may have a first surface on which the image-capturing chip is implemented. The substrate may have a second surface that is opposite to the first surface. The restricting unit may be provided to the second surface.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
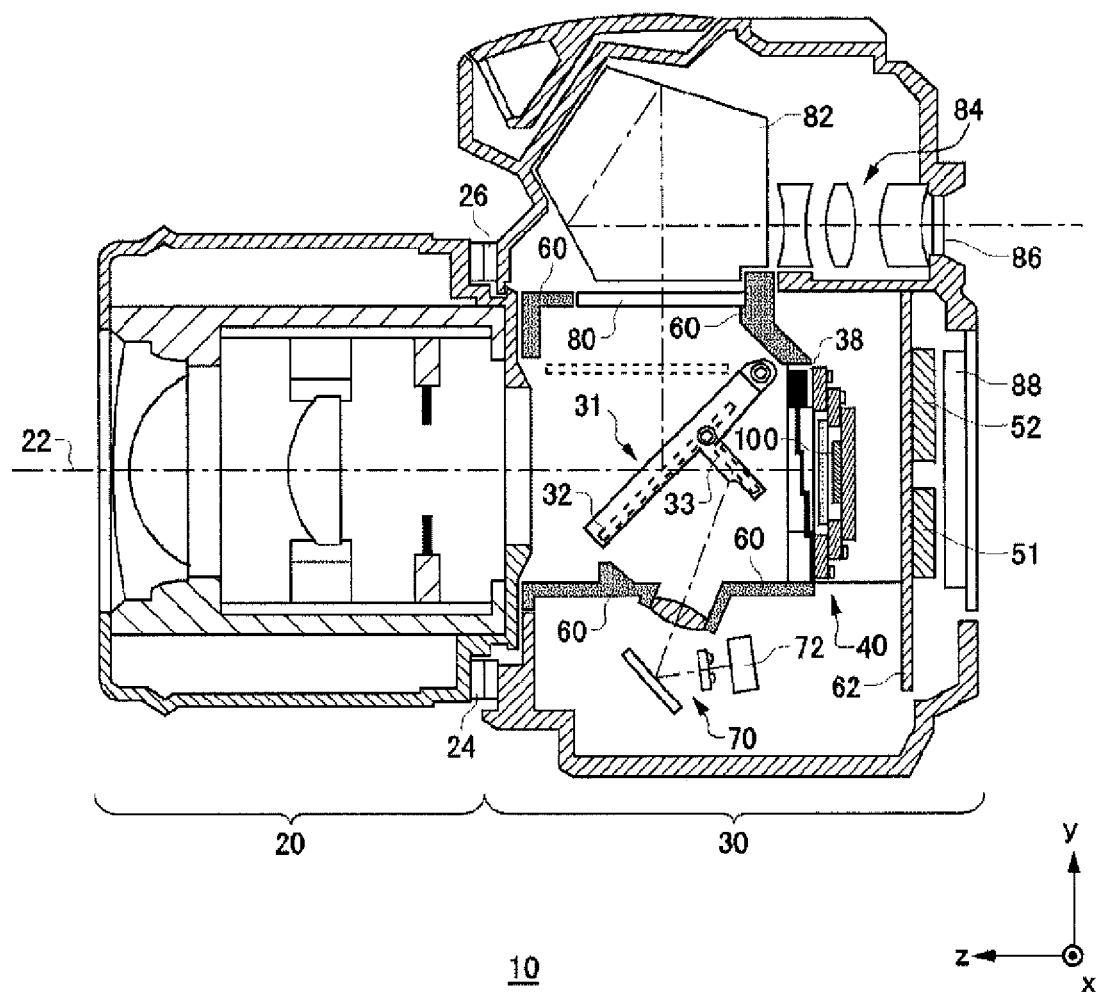
FIG. 1 is a schematic sectional view of a camera 10 which is one example of an image-capturing apparatus.

FIG. 1 is a schematic sectional view of a camera 10 which is one example of an image-capturing apparatus. The camera 10 comprises a lens unit 20 and a camera body 30. The lens unit 20 is fit to the camera body 30. The lens unit 20 comprises, inside its lens-barrel, an optical system arrayed along an optical axis 22, and guides an incident subject light flux to an image-capturing unit 40 of the camera body 30.

In the present embodiment, the direction along the optical axis 22 is defined as the z-axis direction. That is, the direction in which a subject light flux is incident on an image-capturing chip 100 that the image-capturing unit 40 has is defined as the z-axis direction. Specifically, the direction in which a subject light flux is incident is defined as the negative z-axis direction, and the opposite direction is defined as the positive z-axis direction. The longitudinal direction of the image-capturing chip 100 is defined as the x-axis direction. The short direction of the image-capturing chip 100 is defined as the y-axis direction. Specifically, the x-axis direction and the y-axis direction are defined as directions illustrated in FIG. 1. The x-axis, y-axis and z-axis form a right-handed, rectangular coordinate system. Note that for convenience of explanation, the positive z-axis direction may be sometimes called "forward," "front," etc. Also, the negative z-axis direction may be sometimes called "backward," "rear," etc. The side in the negative z-axis direction may be sometimes called a back side, etc.

The camera body 30 has a mirror unit 31 at a position in the negative z-axis direction past a body mount 26 coupled with a lens mount 24. The mirror unit 31 includes a main mirror 32 and a sub mirror 33. The main mirror 32 is pivotably supported rotatably between a penetration position at which it penetrates the optical path of a subject light flux emitted by the lens unit 20, and an evacuation position at which it evacuates from the optical path of the subject light flux. The sub mirror 33 is pivotably supported rotatably relative to the main mirror 32. The sub mirror 33 penetrates into the penetration position together with the main mirror 32, and evacuates to the evacuation position together with the main mirror 32. In this manner, the mirror unit 31 is in a penetrated state in which it has penetrated the optical path of a subject light flux and an evacuation state in which it has evacuated from the subject light flux.

When the mirror unit 31 is in a penetrated state, a portion of a subject light flux having being incident on the main mirror 32 is guided to a focus plate 80 by being reflected on the main mirror 32. The focus plate 80 is disposed at a conjugate position of the image-capturing surface of the image-capturing chip 100 that the image-capturing unit 40 has, and visualizes a subject image formed by the optical system of the lens unit 20. The subject image formed on the focus plate 80 is observed through a finder window 86 via a pentaprism 82 and a finder optical system 84 to be.

When the mirror unit 31 is in the penetrated state, a light flux other than a subject light flux reflected on the main mirror 32 of the subject light flux having been incident on the main mirror 32 is incident on the sub mirror 33. Specifically, the main mirror 32 has a half-mirror region, and a subject light flux having been transmitted through the half-mirror region of the main mirror 32 is incident on the sub mirror 33. The sub mirror 33 reflects a light flux having been incident from the half-mirror region toward an imaging optical system 70. The imaging optical system 70 guides the incident light flux to a focus detection sensor 72 for detecting a focus position. The focus detection sensor 72 outputs a detection result about the focus position to an MPU 51.

The focus plate 80, the pentaprism 82, the main mirror 32, the sub mirror 33 and the finder optical system 84 are supported by a mirror box 60 as a support member. When the mirror unit 31 is in an evacuation state and a front curtain and a rear curtain of a shutter unit 38 are open, a subject light flux transmitted through the lens unit 20 reaches the image-capturing surface of the image-capturing chip 100.

A substrate 62 and a display unit 88 are sequentially arranged at positions in the negative z-axis direction from the image-capturing unit 40. A liquid crystal panel or the like can be used as the display unit 88, for example. The display surface of the display unit 88 appears on the rear side of the camera body 30. The display unit 88 displays an image generated based on output signals from the image-capturing chip 100.

Electronic circuits such as the MPU 51 or an ASIC 52 are implemented on the substrate 62. The MPU 51 performs the overall control of the camera 10. Output signals from the image-capturing chip 100 are output to the ASIC 52 via a flexible printed substrate or the like. The ASIC 52 processes output signals output from the image-capturing chip 100.

The ASIC 52 generates image data for display based on output signals from the image-capturing chip 100. The display unit 88 displays an image based on the image data for display generated by the ASIC 52. The ASIC 52 generates image data for recording based on output signals from the image-capturing chip 100. The ASIC 52 generates the image data for recording by performing, for example, an image process or a compression process on output signals from the image-capturing chip. The image data for recording generated by the ASIC 52 is recorded in a recording medium fit to the camera body 30. The recording medium is configured to be attachable to and detachable from the camera body 30.

Figure 2:
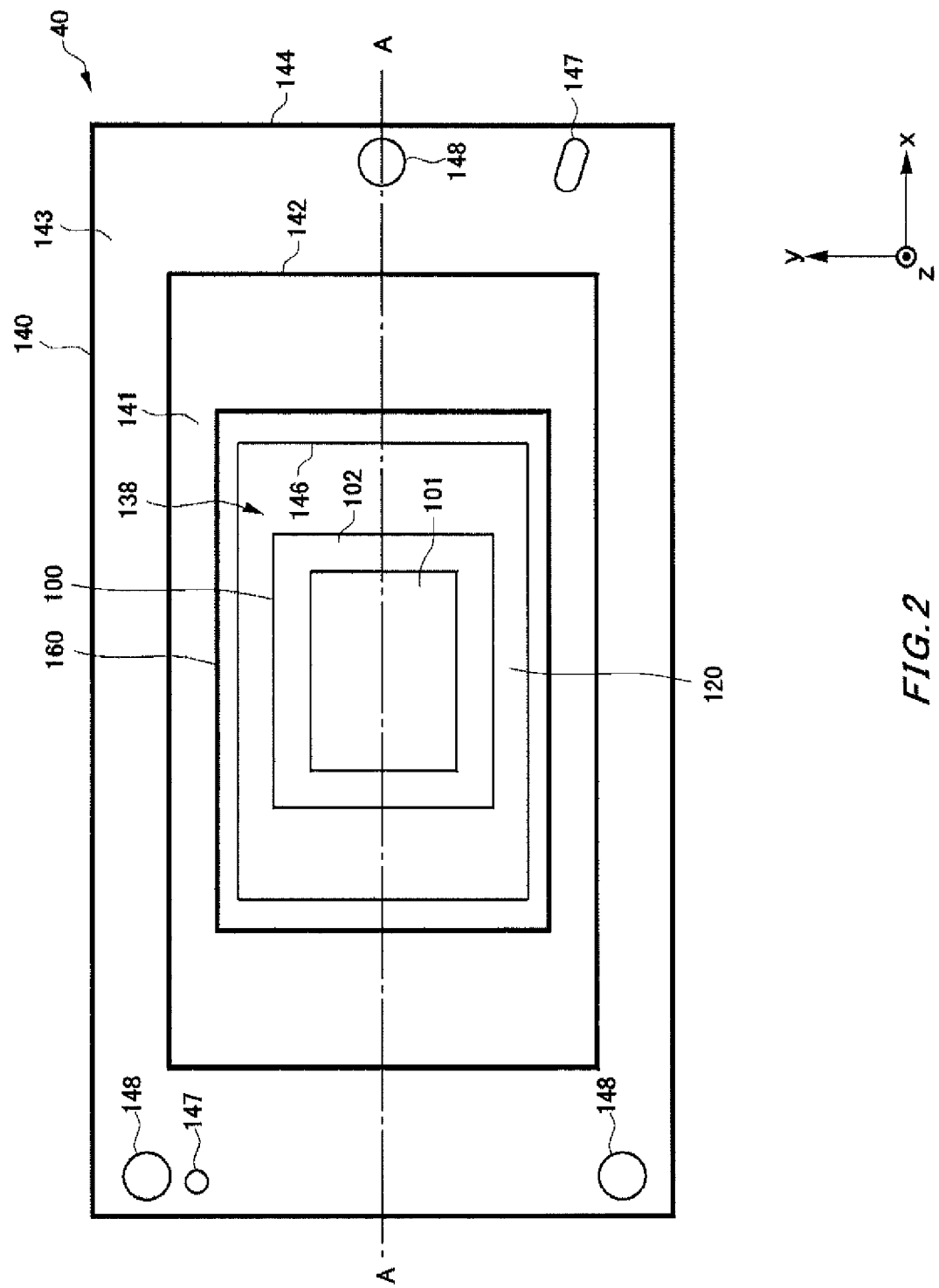
FIG. 2 is a top surface view schematically showing an image-capturing unit 40.

FIG. 2 is a top surface view schematically showing the image-capturing unit 40.

Figure 3:
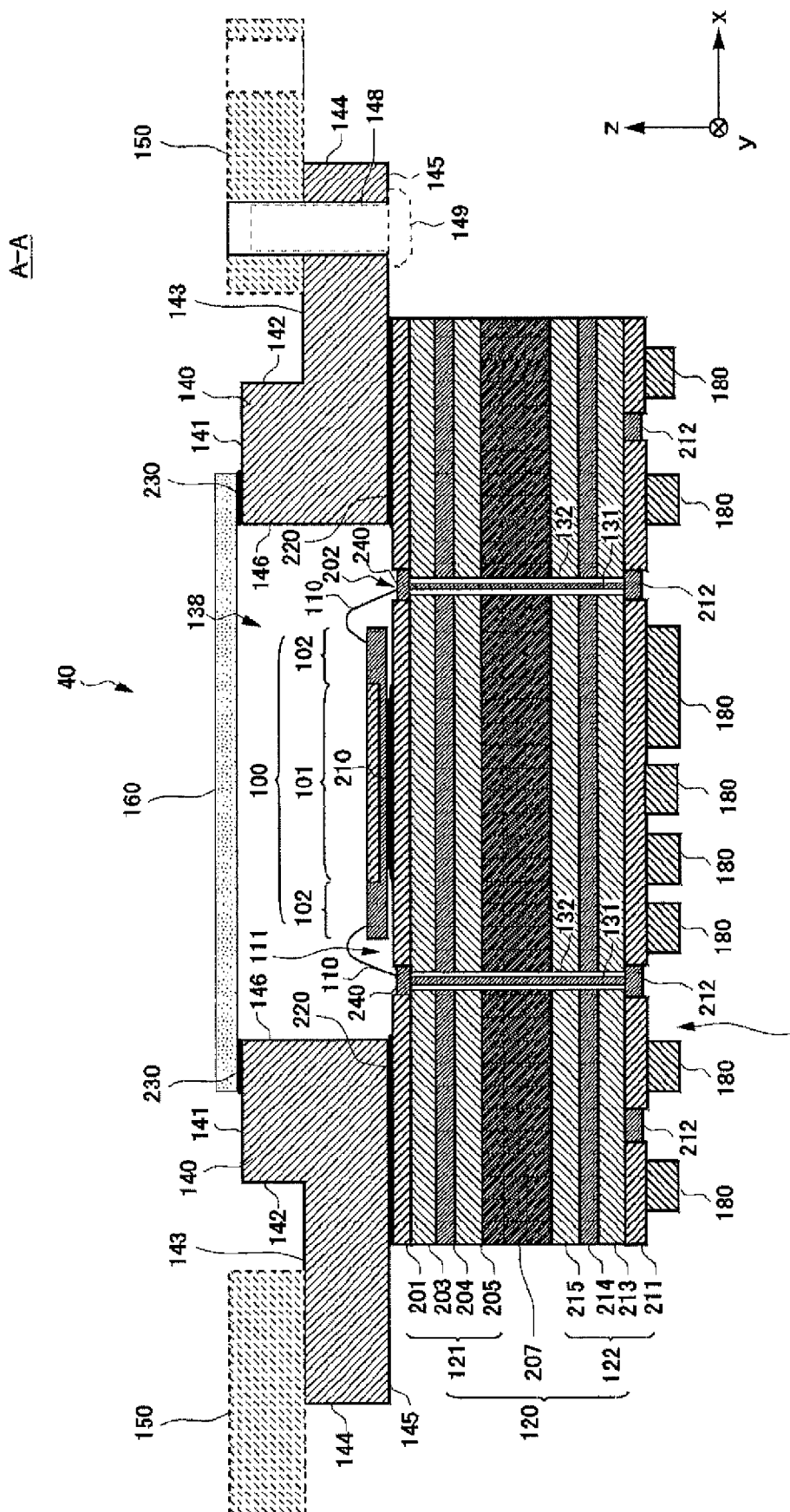
FIG. 3 is a cross-sectional view schematically showing a cross-section taken through A-A in FIG. 2.

FIG. 3 is a cross-sectional view schematically showing a cross-section taken through A-A in FIG. 2. The image-capturing unit 40 is configured to include the image-capturing chip 100, an implementation substrate 120, a frame 140 and a cover glass 160.

The image-capturing chip 100 is a CMOS image sensor or a CCD image sensor. The image-capturing chip 100 is configured to include an image-capturing region 101 and a peripheral region 102. The image-capturing region 101 is formed at a central portion of the image-capturing chip 100. In the image-capturing region 101 of the image-capturing chip 100, an image-capturing surface is formed with a plurality of photoelectric converting elements that perform photoelectric conversion on subject light. The peripheral region 102 of the image-capturing chip 100 is positioned in the periphery of the image-capturing region 101. The peripheral region 102 of the image-capturing chip 100 has a processing circuit that reads out pixel signals obtained by photoelectric conversion in the photoelectric converting elements, and performs signal processing on the pixel signals. The processing circuit includes an AD conversion circuit that converts output pixel signals into digital signals.

The image-capturing chip 100 is implemented on the implementation substrate 120. The image-capturing chip 100 is implemented for example by flip-chip on the implementation substrate 120. The image-capturing chip 100 is electrically connected with the implementation substrate 120 via bonding wires 110. The pixel signals obtained by conversion into digital signals by the AD conversion circuit of the image-capturing chip 100 are output to the implementation substrate 120 via the bonding wires 110. The image-capturing chip 100 adhere to the implementation substrate 120 through an adhesive. The image-capturing chip 100 is housed in an opening portion 138 of the frame 140. The frame 140 is one example of a surrounding member that surrounds the image-capturing chip 100.

The implementation substrate 120 is where the image-capturing chip 100 is implemented. The implementation substrate 120 includes a first layer 121, a core layer 207 and a second layer 122. The first layer 121 includes a solder resist layer 201, a wiring layer 202, an insulation layer 203, a wiring layer 204 and an insulation layer 205. The second layer 122 includes an insulation layer 215, a wiring layer 214, an insulation layer 213, a wiring layer 212 and a solder resist layer 211. The implementation substrate 120 is a multilayer core substrate that has the core layer 207 as its core layer.

In the implementation substrate 120, the image-capturing chip 100, the solder resist layer 201, the wiring layer 202, the insulation layer 203, the wiring layer 204, the insulation layer 205, the core layer 207, the insulation layer 215, the wiring layer 214, the insulation layer 213, the wiring layer 212 and the solder resist layer 211 are disposed in this order along the optical axis 22.

The insulation layer 203, the insulation layer 205, the insulation layer 215 and the insulation layer 213 are resin layers, for example. The respective thicknesses of the insulation layer 203, the insulation layer 205, the insulation layer 215 and the insulation layer 213 are 20 μm to 50 μm. Note that the thicknesses are lengths in the z-axis direction.

The wiring layer 202, the wiring layer 204, the wiring layer 214 and the wiring layer 212 include wiring patterns. An alloy of nickel and iron (for example, 42 alloy or 56 alloy), copper, aluminum or the like can be used as materials of the wiring layer 202, the wiring layer 204, the wiring layer 214 and the wiring layer 212. The respective thicknesses of wiring patterns that the wiring layer 202, the wiring layer 204, the wiring layer 214 and the wiring layer 212 have are approximately 10 μm to 50 μm.

The core layer 207 is formed with metal. When the core layer 207 is to be formed with metal, an alloy of nickel and iron (for example, 42 alloy or 56 Alloy), copper, aluminum or the like may be used as a material of the core layer 207, for example. The thickness of the core layer 207 is larger than the thickness of either wiring layer of the wiring layer 202, the wiring layer 204, the wiring layer 214 and the wiring layer 212. The thickness of the core layer 207 is larger than the thickness of either insulation layer of the insulation layer 203, the insulation layer 205, the insulation layer 215 and the insulation layer 213. Specifically, the thickness of the core layer 207 is approximately 0.1 mm to 0.8 mm. The rigidity of the core layer 207 is higher than the rigidity of either wiring layer of the wiring layer 202, the wiring layer 204, the wiring layer 214 and the wiring layer 212. The rigidity of the core layer 207 may be higher than the rigidity of the first layer 121. The rigidity of the core layer 207 may be higher than the rigidity of the second layer 122.

Note that the core layer 207 may be formed with resin. When the core layer 207 is to be formed with resin, the core layer 207 may be formed by using FR4 or a material having a modulus of elasticity higher than that of FR4, for example. When the core layer 207 is to be formed with resin, the core layer 207 is sandwiched by wiring layers in the z-axis direction. For example, when the core layer 207 is to be formed with resin, the image-capturing chip 100, the solder resist layer 201, the wiring layer 202, the insulation layer 203, the wiring layer 204, the core layer 207, the wiring layer 214, the insulation layer 213, the wiring layer 212 and the solder resist layer 211 may be disposed in this order along the optical axis 22. When two wiring layers are to be additionally disposed, an additional insulation layer that contacts the wiring layer 204 and an additional wiring layer that contacts the core layer 207 are disposed sequentially along the optical axis 22 and between the wiring layer 204 and the core layer 207, and an additional wiring layer that contacts the core layer 207 and an additional insulation layer that contacts the wiring layer 214 are disposed sequentially along the optical axis 22 between the core layer 207 and the wiring layer 214.

In this manner, the implementation substrate 120 is a multilayer core substrate having a metal core or a resin core. The thickness of the entire implementation substrate 120 may be approximately 0.3 mm to 1.0 mm.

At least a portion of the wiring layer 202 is used for a wiring pattern that receives pixel signals output from the image-capturing chip 100 via the bonding wires 110. The wiring layer 202 includes a bonding pad 240 to which the bonding wires 110 are connected.

A wiring pattern included in the wiring layer 204 and a wiring pattern included in the wiring layer 214 can be used for a ground line, a power supply line or the like, for example.

The image-capturing chip 100 is implemented on the solder resist layer 201. The image-capturing chip 100 is electrically connected to the bonding pad 240 by the bonding wires 110. The bonding pad 240 and the wiring layer 212 are electrically connected by vias 131 that penetrate the first layer 121 and the core layer 207. The vias 131 are covered by insulators 132. Pixel signals output from the image-capturing chip 100 are transmitted to the wiring layer 212 via the wiring layer 202 and the vias 131.

Electronic components 180 are provided on the solder resist layer 211. That is, the electronic components 180 are implemented in the implementation substrate 120 and on a second main surface 112 opposite to the first main surface 111 on which the image-capturing chip 100 is implemented. The electronic components 180 include, for example, a connector, a capacitor, a resistor, a regulator, a transistor and the like. Some components of the electronic components 180 configure a power supply circuit 410 described below. Some components of the electronic components 180 con-figure a voltage variation suppression circuit 420 described below. Some components of the electronic components 180 configure a discharge circuit 430 described below.

For example, a flexible substrate is connected to a connector as a component among the electronic components 180. The connector as a component among the electronic components 180 is connected to the wiring layer 212, and pixel signals transmitted to the wiring layer 212 are transmitted to an external electronic circuit such as the ASIC 52 via the connector and the flexible substrate.

The electronic components 180 and the wiring layer 212 are electrically connected by lead members. The lead members for the electronic components 180 are fixed to the wiring layer 212 by solder or the like. A portion of the wiring layer 212 is exposed to the outside through openings formed in the solder resist layer 211, and provides an electrode such as a land.

The image-capturing chip 100 is implemented on the implementation substrate 120 by COB (chip-on-board). The image-capturing chip 100 is implemented by adhering to the implementation substrate 120 for example through an adhering portion 210. Specifically, the image-capturing chip 100 adheres to the solder resist layer 201 of the implementation substrate 120 through the adhering portion 210. The adhering portion 210 is formed for example by an adhesive. Specifically, the adhering portion 210 is formed by thermal curing of a thermocurable adhesive. The image-capturing chip 100 is implemented on the implementation substrate 120 by being subjected to an image-capturing chip implementing step. When implementing the image-capturing chip 100 on the implementation substrate 120 at the image-capturing chip implementing step, the implementation substrate 120 is heated. The image-capturing chip 100 is implemented on the heated implementation substrate 120 by thermocompression bonding.

The bonding wires 110 are implemented on the image-capturing chip 100 and the bonding pad 240. The bonding wires 110 electrically connect the image-capturing chip 100 and the bonding pad 240 by being subjected to the wire bonding step (bonding wire implementing step). When the bonding wires 110 are implemented on the bonding pad 240 at the wire bonding step, the bonding pad 240 is heated, and the bonding wires 110 are implemented on the heated bonding pad 240 by thermocompression bonding. At the wire bonding step, the bonding wires 110 may be implemented on the bonding pad 240 by ultrasonic compression bonding.

The frame 140 adheres to the implementation substrate 120 through an adhering portion 220. Specifically, the frame 140 adheres to the solder resist layer 201 of the implementation substrate 120 through the adhering portion 220. The adhering portion 220 is formed for example by an adhesive. Specifically, the adhering portion 220 is formed by thermal curing of a thermocurable adhesive. The adhering portion 220 is formed by thermal curing of a thermocurable adhesive. At a frame implementing step, the frame 140 is implemented on the implementation substrate 120. When the frame 140 is implemented on the implementation substrate 120 at the frame implementing step, the frame 140 is heated, and the frame 140 is implemented on the heated implementation substrate 120 by thermocompression bonding.

In this manner, at the steps of implementing the image-capturing chip 100, the bonding wires 110 and the frame 140, heat is applied to the image-capturing chip 100. That is, at the step of manufacturing the image-capturing unit 40, heat is applied to the image-capturing chip 100. The image-capturing unit 40 that has been manufactured by being subjected to the manufacturing step is subjected to an inspection including measurement of a leakage current of the image-capturing chip 100, at the step of inspecting the image-capturing unit 40.

The frame 140 has a first surface 141, a second surface 142, a third surface 143, a fourth surface 144, a fifth surface 145 and a sixth surface 146. The sixth surface 146 forms the opening portion 138. The sixth surface 146 forms an inner wall surface of the frame 140. The opening portion 138 is formed at a central portion on the xy plane, for example.

The first surface 141 is a surface that adheres to the cover glass 160 through an adhering portion 230. The first surface 141 is a surface that contacts an end portion of the sixth surface 146. The first surface 141 is formed along the outer edge of the sixth surface 146. The first surface 141 is a surface that is approximately parallel with the xy plane.

The second surface 142 is a surface that contacts an end portion of the first surface 141. The second surface 142 is a surface formed along the outer edge of the first surface 141. The second surface 142 has a surface that is approximately parallel with the yz plane, and a surface that is approximately parallel with the xz plane.

The third surface 143 is a surface that contacts an end portion of the second surface 142. The third surface 143 is a surface that is approximately parallel with the xy plane, and a surface that is approximately parallel with the first surface 141.

The fourth surface 144 is a surface that contacts an end portion of the third surface 143. The fourth surface 144 is a surface formed along the outer edge of the third surface 143. The fourth surface 144 has a surface that is approximately parallel with the yz plane, and a surface that is approximately parallel with the xz plane.

The fifth surface 145 is a surface that contacts an end portion of the fourth surface 144. The fifth surface 145 is a surface formed along the outer edge of the fourth surface 144. The fifth surface 145 is a surface that is approximately parallel with the xy plane. The fifth surface 145 is a surface that is approximately parallel with the first surface 141 and the third surface 143. The fifth surface 145 is a surface that adheres to the solder resist layer 201 of the implementation substrate 120 through the adhering portion 220. The fifth surface 145 faces the adhering portion 220. The fifth surface 145 is a surface that contacts an end portion of the sixth surface 146. The fifth surface 145 is formed along the outer edge of the sixth surface 146.

The frame 140 has step portions formed by the first surface 141, the second surface 142 and the third surface 143. The frame 140 has a mount hole 148 as a mount portion. The frame 140 has three mount holes 148, for example. All the three mount holes 148 are holes that penetrate from the third surface 143 to the fifth surface 145. All the three mount holes 148 are utilized for mounting the image-capturing unit 40 on another structure such as the mirror box 60.

The frame 140 is fixed to a bracket 150 for example by being screwed with screws 149 via the three mount holes 148. The bracket 150 is fixed to the mirror box 60 for example by being screwed. Thus, the image-capturing unit 40 is fixed to the mirror box 60.

When the frame 140 and the bracket 150 are screwed by the screws 149 which are made of, for example, metal with the use of the mount holes 148, a heat transfer path for allowing heat generated when the image-capturing chip 100 is in operation to be released toward the mirror box 60 via the screws 149 can be formed.

The frame 140 has positioning holes 147. The frame 140 has two positioning holes 147, for example. All the two positioning holes 147 are holes that penetrate from the third surface 143 to the fifth surface 145. All the positioning holes 147 are utilized for positioning the image-capturing unit 40 relative to the image-capturing unit 40. Among the two positioning holes 147, one positioning hole is formed as a fitting hole, and the other positioning hole 147 is formed as a long hole.

The frame 140 is positioned relative to the bracket 150 with the use of the two positioning holes 147. For example, by two positioning pins provided to the bracket 150 being inserted to the two positioning holes 147, the frame 140 and the bracket 150 are positioned. The frame 140 is fixed to the bracket 150 in a state where the frame 140 is positioned relative to the bracket 150. Thus, the image-capturing unit 40 is fixed to the mirror box 60 in a state where the image-capturing unit 40 is positioned relative to the mirror box 60. Note that the frame 140 and the bracket 150 may be fixed to another structure other than the mirror box 60.

Note that the image-capturing unit 40 may be fixed to the mirror box 60 not via the bracket 150. The image-capturing unit 40 may be fixed to the mirror box 60 for example by being screwed via the three mount holes 148.

The cover glass 160 is used for sealing the image-capturing chip 100. The cover glass 160 is fixed to the frame 140 so as to cover the opening portion 138 of the frame 140. Together with the frame 140 and the implementation substrate 120, the cover glass 160 makes the opening portion 138 a sealed space.

The cover glass 160 adheres to the frame 140 through the adhering portion 230. The adhering portion 230 is formed by an adhesive. Specifically, the adhering portion 220 is formed by curing a photocurable adhesive. For example, the adhering portion 230 is formed by curing a ultraviolet ray-curable adhesive with a ultraviolet ray. As a material of the cover glass 160, borosilicate glass, quartz glass, non-alkali glass, heat resistant glass or the like can be used. The cover glass 160 is light-transmissive. The thickness of the cover glass 160 is 0.5 mm to 0.8 mm.

The cover glass 160 is fixed to the frame 140 after the image-capturing chip 100, the bonding wires 110 and the frame 140 are implemented on the implementation substrate 120. Because the cover glass 160 is light-transmissive, the cover glass 160 and the frame 140 can adhere to each other through a photocurable adhesive. Note that the cover glass 160 is one example of a light-transmissive member. Other than glass, crystal or the like can be used as a light-transmissive member.

In this manner, a sealed space is formed by the implementation substrate 120, the frame 140 and the cover glass 160. The image-capturing chip 100 is arranged in the sealed space formed by the implementation substrate 120, the frame 140 and the cover glass 160. Thereby, the image-capturing chip 100 becomes less likely to be influenced by the external environment. For example, the image-capturing chip 100 becomes less likely to be influenced by moisture content existing outside the sealed space. For this reason, degradation of the image-capturing chip 100 can be prevented.

Figure 4:
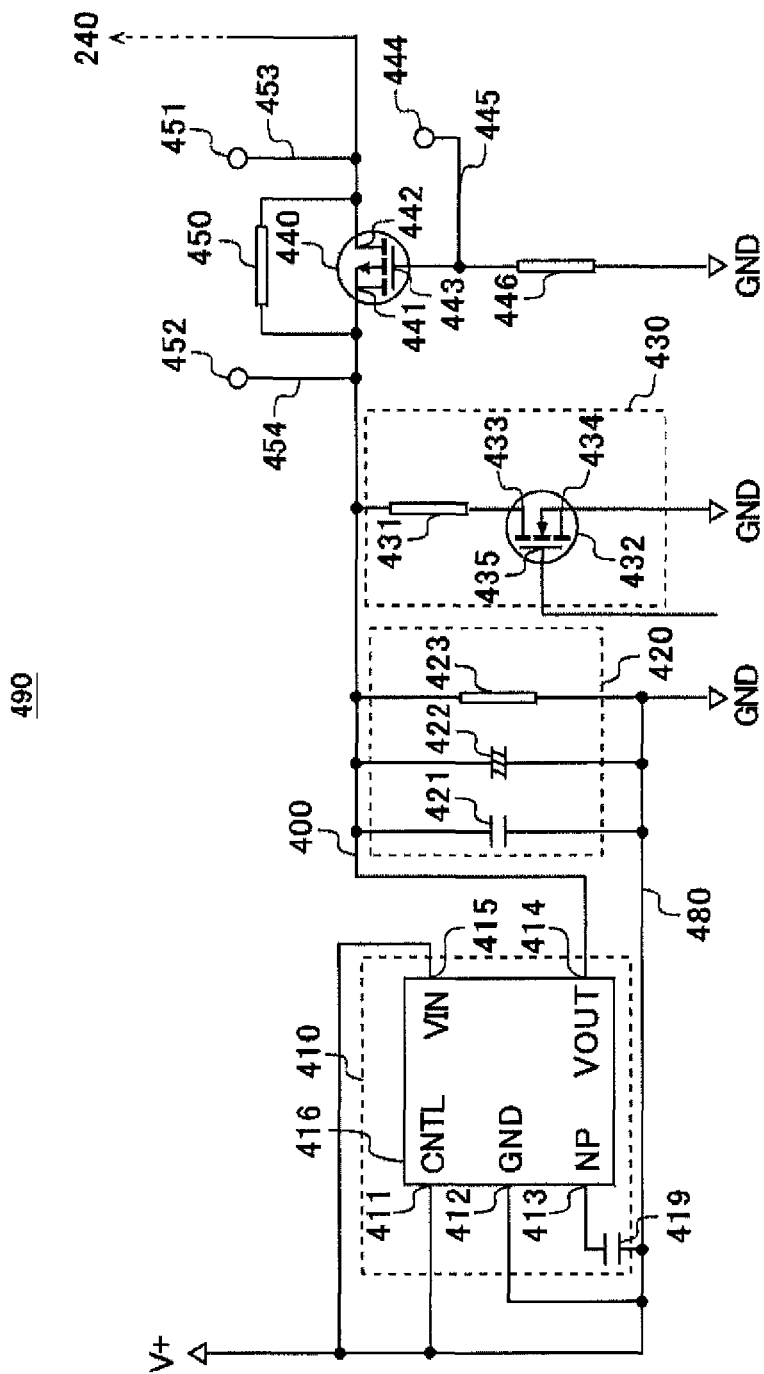
FIG. 4 is a circuit diagram schematically showing an electrical power supply circuit 490 in a first implementation example.

FIG. 4 is a circuit diagram schematically showing an electrical power supply circuit 490 in a first implementation example. The electrical power supply circuit 490 has a power supply line 400, a ground line 480, a power supply circuit 410, a voltage variation suppression circuit 420, a discharge circuit 430, a FET 440, a control line 445, a control land 444, a pull down resistor 446, a measurement resistor 450, a measurement land 451, a measurement land 452, a measurement line 453 and a measurement line 454.

The power supply circuit 410, the voltage variation suppression circuit 420, the discharge circuit 430, the FET 440, the control land 444, the pull down resistor 446, the measurement resistor 450, the measurement land 451 and the measurement land 452 are included as a portion of the electronic component 180. The power supply line 400, the ground line 480, the control line 445, the measurement line 453 and the measurement line 454 are formed by wiring patterns included in the wiring layer 212.

The power supply line 400 is formed by, among the wiring patterns included in the wiring layer 212, a power supply pattern that feeds electrical power to the image-capturing chip 100. The ground line 480 is formed by, among the wiring patterns included in the wiring layer 214, a ground pattern that provides ground potential of the image-capturing unit 40.

The power supply circuit 410 outputs electrical power to be fed to the image-capturing chip 100. The electrical power output by the power supply circuit 410 is fed to the image-capturing chip 100 through the power supply line 400.

The power supply circuit 410 has a regulator 416 and a capacitor 419. The regulator 416 is one example of a voltage output circuit that outputs constant voltage. As one example, the regulator 416 is a series regulator. The regulator 416 has a control terminal 411, a GND terminal 412, a noise pass pin 413, an output terminal 414 and an input terminal 415.

A power supply voltage V+ is applied to the input terminal 415. The power supply voltage V+ is provided from a power supply unit that the camera 10 comprises. The power supply unit is generated by using electrical power accumulated in a battery fit to the camera 10. Voltage to control operation of the regulator 416 is applied to the control terminal 411. Voltage which is the same as voltage applied to the input terminal 415 is applied to the control terminal 411.

The GND terminal 412 is electrically connected to the ground line 480. For example, the GND terminal 412 is electrically connected to the ground line 480 by solder.

The noise pass pin 413 is electrically connected to one end of the capacitor 419. The other end of the capacitor 419 is electrically connected to the ground line 480. By connecting the capacitor to the noise pass pin 413, temporal variation in output voltage output from the output terminal 414 is suppressed.

When the value of a voltage applied to the control terminal 411 exceeds a predetermined value, the regulator 416 outputs constant voltage from the output terminal 414 by using electrical power fed from the input terminal 415. Specifically, the regulator 416 outputs constant voltage from the output terminal 414 by lowering and stabilizing voltage applied to the input terminal 415.

The output terminal 414 is electrically connected to the power supply line 400. The output terminal 414 is electrically connected to the power supply line 400 that the image-capturing unit 40 has. For example, the output terminal 414 is electrically connected to the power supply line 400 by solder. The power supply line 400 forms a feed line from the output terminal 414 to the bonding pad 240 connected to a feed terminal of the image-capturing chip 100.

The voltage variation suppression circuit 420 is implemented on the implementation substrate 120 in a state where the voltage variation suppression circuit 420 is electrically connected to the power supply line 400, and suppresses temporal variation in voltage output by the power supply circuit 410. The voltage variation suppression circuit 420 has a first capacitor 421, a second capacitor 422 and a resistor 423.

One end of the first capacitor 421 is electrically connected to the power supply line 400, and the other end of the first capacitor 421 is electrically connected to the ground line 480. One end of the second capacitor 422 is electrically connected to the power supply line 400, and the other end of the second capacitor 422 is electrically connected to the ground line 480. One end of the resistor 423 is electrically connected to the power supply line 400, and the other end of the resistor 423 is electrically connected to the ground line 480.

The first capacitor 421 suppresses relatively high frequency voltage variation. The first capacitor 421 is a ceramic condenser, for example. The second capacitor 422 suppresses relatively low frequency voltage variation. The second capacitor 422 is an electrolytic condenser, for example.

The second capacitor 422 can absorb relatively large voltage variation. The capacity of the second capacitor 422 is higher than the capacity of the first capacitor 421. The capacity of the second capacitor 422 may be about ten times as large as the capacity of the first capacitor 421. The capacity of the first capacitor 421 may be within the range of 0.1 to 10 µF. The capacity of the second capacitor 422 may be within the range of 10 to 560 µF. The resistance value of the resistor 423 may be 1 kΩ or higher, for example. Note that the configuration of the voltage variation suppression circuit 420 may have only either one of the first capacitor 421 and the second capacitor 422. The configuration of the voltage variation suppression circuit 420 may not have the resistor 423.

The discharge circuit 430 is implemented on the implementation substrate 120 in a state where discharge circuit 430 is electrically connected to the power supply line 400, and discharges electrical charges accumulated in the image-capturing chip 100. The discharge circuit 430 has a resistor 431 and a FET 432. The FET 432 is an N-channel MOSFET. The FET 432 is one example of a switch that controls discharging of residual electric charges in the inner circuit of the image-capturing chip 100. One end of the resistor 431 is electrically connected to the power supply line 400, and the other end of the resistor 431 is electrically connected to a drain terminal 433 of the FET 432. The resistance value of the resistor 431 is 100Ω, for example. The resistance value of the resistor 431 may be within the range of 20Ω to 500Ω, for example. A source terminal 434 of the FET 432 is electrically connected to the ground line 480. Note that when performing only operation that do not leave residual electric charges in the inner circuit of the image-capturing chip 100, the discharge circuit 430 may not be implemented on the implementation substrate 120.

Control voltage to control operation of the FET 432 is applied to a gate terminal 435 of the FET 432. When a predetermined positive voltage is applied to the gate terminal 435, the drain terminal 433 and source terminal 434 of the FET 432 become conductive. In this case, the power supply line 400 is electrically connected to the ground line 480 via the resistor 431. Thereby, residual electric charges in the inner circuit of the regulator 416 are discharged to the ground line 480 through the power supply line 400 and the discharge circuit 430. Also, residual electric charges accumulated in the first capacitor 421 and second capacitor 422 of the voltage variation suppression circuit 420 are discharged to the ground line 480 through the power supply line 400 and the discharge circuit 430. Also, when the source-drain of the FET 440 described below is conductive, residual electric charges in the inner circuit of the image-capturing chip 100 are discharged to the ground line 480 through the power supply line 400 and the discharge circuit 430.

The FET 440 is provided to the power supply line 400. The FET 440 is a P-channel MOSFET. The FET 440 is one example of an adjusting unit that adjusts electrical current that flows from the power supply circuit 410 to the image-capturing chip 100 so that the electrical current becomes smaller when a leakage current of the image-capturing chip 100 is being measured, as compared with when a leakage current of the image-capturing chip 100 is not being measured. The FET 440 makes an electrical resistance between the power supply circuit 410 and the image-capturing chip 100 higher when a leakage current of the image-capturing chip 100 is being measured, as compared with when a leakage current of the image-capturing chip 100 is not being measured.

A source terminal 441 of the FET 440 is electrically connected to the power supply circuit 410 side in the power supply line 400. A drain terminal 442 of the FET 440 is electrically connected to the image-capturing chip 100 side in the power supply line 400. When the source terminal 441 and drain terminal 442 of the FET 440 are conductive, the power supply circuit 410 and the image-capturing chip 100 are electrically connected, and it becomes possible to feed electrical power from the power supply circuit 410 to the image-capturing chip 100 via the power supply line 400. In this case, the passage of electricity between the source-drain of the FET 440, and the power supply line 400 form a feed line from the output terminal 414 of the regulator 416 to the bonding pad 240 connected to the feed terminal of the image-capturing chip 100.

The control land 444 is electrically connected to a gate terminal 443 of the FET 440 via the control line 445. The gate terminal 443 is electrically connected to the ground line 480 via the pull down resistor 446. When the gate terminal 443 is electrically open, the source terminal 441 and drain terminal 442 of the FET 440 become conductive.

On the other hand, when a predetermined positive voltage is being applied to the control land 444, the source terminal 441 and drain terminal 442 of the FET 440 become non-conductive. In this case, electrical connection between the power supply circuit 410 and the image-capturing chip 100 and via the power supply line 400 is disconnected.

The measurement resistor 450 is connected to the power supply line 400 in parallel with the FET 440. The measurement resistor 450 is used for measuring a leakage current of the image-capturing chip 100. The measurement land 451 is electrically connected to one end of the measurement resistor 450. The measurement land 452 is electrically connected to the other end of the measurement resistor 450. The one end of the measurement resistor 450 is electrically connected to the measurement land 451 via the measurement line 453. The other end of the measurement resistor 450 is electrically connected to the measurement land 452 via the measurement line 454.

With the use of the FET 440, a state where the one end and the other end of the measurement resistor 450 are electrically short-circuited, and a state where they are not electrically short-circuited are switched.

For example, when the control land 444 is electrically floating, the source terminal 441 and drain terminal 442 of the FET 440 become conductive, and the one end and the other end of the measurement resistor 450 become electrically short-circuited. On the other hand, when a predetermined positive voltage is being applied to the control land 444, the source terminal 441 and drain terminal 442 of the FET 440 become non-conductive, and the one end and the other end of the measurement resistor 450 become electrically not short-circuited.

Measurement of a leakage current of the image-capturing chip 100 is performed while the source terminal 441 and drain terminal 442 of the FET 440 are non-conductive. That is, measurement of a leakage current is performed in a state where a predetermined positive voltage is applied to the control land 444. In this state, the image-capturing chip 100 and the power supply circuit 410 are not electrically connected via the power supply line 400, and the image-capturing chip 100 and the power supply circuit 410 are connected via the measurement resistor 450. Thereby, as compared with when the image-capturing chip 100 and the power supply circuit 410 are electrically connected via the power supply line 400, a leakage current of the image-capturing chip 100 can be measured more precisely.

In the power supply line 400, the FET 440 is provided on the power supply circuit 410 side relative to the measurement land 451, and when a leakage current of the image-capturing chip 100 is measured, electrically disconnects the measurement land 451 and the power supply circuit 410.

Note that in the power supply line 400, the FET 440 is provided on the image-capturing chip 100 side relative to a part at which the discharge circuit 430 is connected. Accordingly, the discharge circuit 430 is electrically disconnected from the image-capturing chip 100 by the FET 440 when a leakage current of the image-capturing chip 100 is measured. For this reason, as compared with when the discharge circuit 430 is provided on the image-capturing chip 100 side relative to the FET 440, a leakage current can be measured more precisely.

In the power supply line 400, the FET 440 is provided on the image-capturing chip 100 side relative to a part at which the voltage variation suppression circuit 420 is connected. Accordingly, the voltage variation suppression circuit 420 is electrically disconnected from the image-capturing chip 100 by the FET 440 when a leakage current of the image-capturing chip 100 is measured. For this reason, as compared with when the voltage variation suppression circuit 420 is provided on the image-capturing chip 100 side relative to the FET 440, a leakage current can be measured more precisely.

The measurement resistor 450 has a resistance value pre-designed based on precision of measuring a leakage current of the image-capturing chip 100. For example, the resistance value of the measurement resistor 450 is 1 kΩ or higher. The resistance value of the measurement resistor 450 may be 10 kΩ or higher. The resistance value of the measurement resistor 450 is preferably 100 kΩ or higher. The resistance value of the measurement resistor 450 may be 1 MΩ or lower. The resistance value of the measurement resistor 450 is desirably sufficiently lower than the source-drain resistance in a case where the source terminal 441 and drain terminal 442 of the FET 440 are non-conductive.

Figure 5:
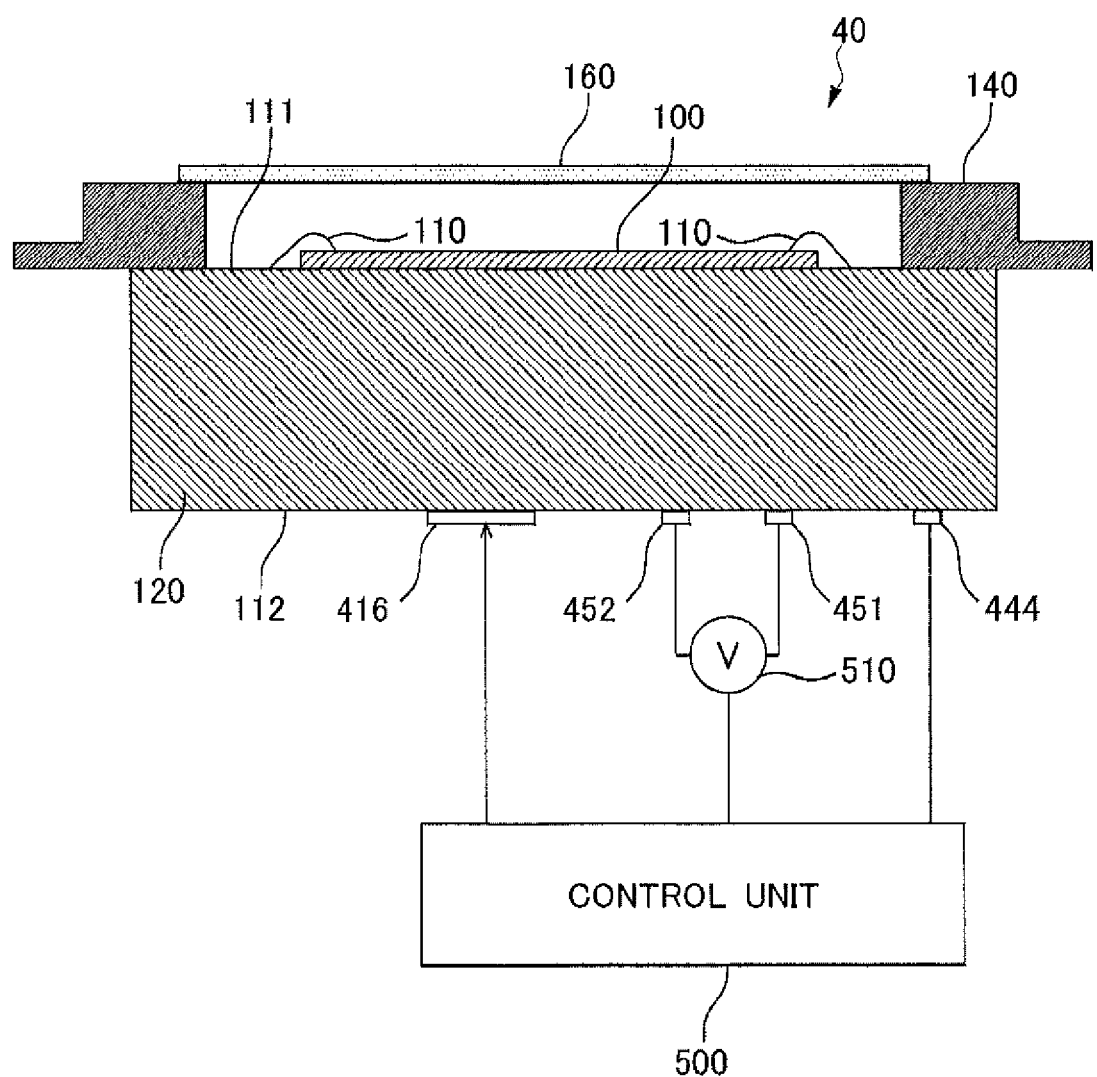
FIG. 5 schematically shows a leakage current measuring system 590.

FIG. 5 schematically shows a leakage current measuring system 590. The leakage current measuring system 590 comprises a control unit 500, a voltage measuring unit 510 and the image-capturing unit 40.

In order to measure a leakage current of the image-capturing chip 100, the control unit 500 brings about a non-driving state where the image-capturing chip 100 does not operate. Also, the control unit 500 applies a positive voltage to the control land 444. Thereby, one end and the other end of the measurement resistor 450 become electrically not short-circuited. In this state, the control unit 500 causes the regulator 416 to operate by applying a power supply voltage to the regulator 416, and causes the voltage measuring unit 510 to measure a voltage between the measurement land 451 and the measurement land 452. The control unit 500 calculates a leakage current based on a voltage between the measurement land 451 and the measurement land 452 that is measured by the voltage measuring unit 510, and the resistance value of the measurement resistor 450.

The control unit 500 performs quality judgment of the image-capturing chip 100 based on the calculated current value of a leakage current. For example, the control unit 500 judges that the image-capturing chip 100 is a non-conforming article when the calculated current value of a leakage current is higher than a predetermined value. The control unit 500 judges that the image-capturing chip 100 is a conforming article when the calculated current value of a leakage current is equal to or lower than a predetermined value.

Due to the electrical power supply circuit 490 according to the first implementation example, a leakage current of the image-capturing chip 100 can be measured by using the regulator 416 as a current source of the leakage current. For this reason, a leakage current source needs not be prepared separately.

Figure 6:
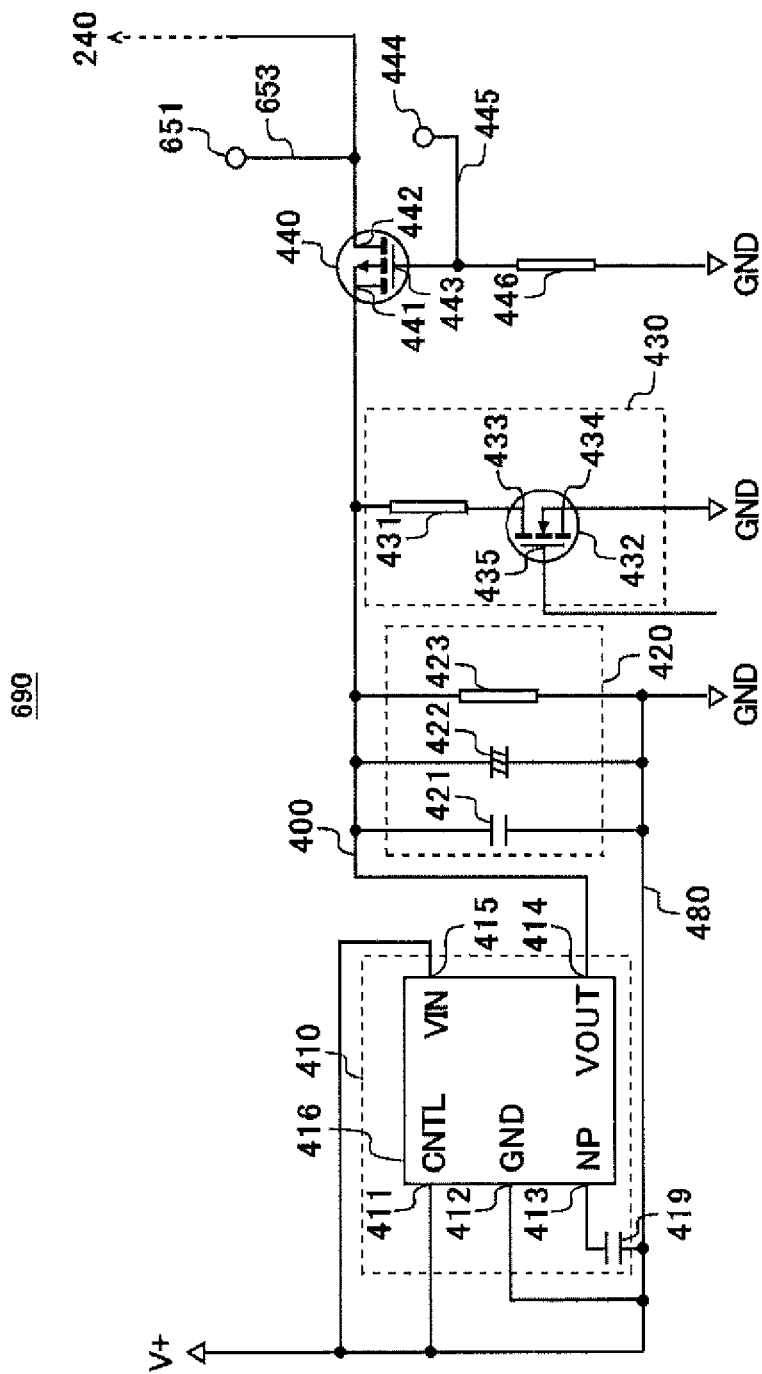
FIG. 6 is a circuit diagram schematically showing an electrical power supply circuit 690 in a second implementation example.

FIG. 6 is a circuit diagram schematically showing an electrical power supply circuit 690 in a second implementation example. Among components that the electrical power supply circuit 690 has, the components that are provided with the same reference numerals as those provided to components that the electrical power supply circuit 490 explained with reference to FIG. 4 and FIG. 5 has have functions and configurations similar to corresponding components that the electrical power supply circuit 490 has. Among components that the electrical power supply circuit 690 has, explanation of the components corresponding to components that the electrical power supply circuit 490 has may be omitted. Among components that the electrical power supply circuit 690 has, only differences of components from the corresponding components that the electrical power supply circuit 490 has may be explained.

The electrical power supply circuit 690 has the power supply line 400, the ground line 480, the power supply circuit 410, the voltage variation suppression circuit 420, the discharge circuit 430, the FET 440, the control line 445, the control land 444, the pull down resistor 446, a measurement land 651 and a measurement line 653.

The measurement land 651 corresponds to the measurement land 451. The measurement line 653 corresponds to the measurement line 453. For this reason, the configuration of the electrical power supply circuit 690 is equivalent to the configuration obtained by excluding the measurement resistor 450, the measurement land 452 and the measurement line 454 from the configuration of the electrical power supply circuit 490.

Measurement of a leakage current of the image-capturing chip 100 is performed in a state where the source terminal 441 and drain terminal 442 of the FET 440 are made non-conductive, and the power supply circuit 410 and the image-capturing chip 100 are electrically disconnected. Measurement of a leakage current of the image-capturing chip 100 is performed by connecting a current source to the measurement land 651.

In this manner, in the power supply line 400, the FET 440 is provided on the power supply circuit 410 side relative to the measurement land 651. Then, when a leakage current of the image-capturing chip 100 is measured, the FET 440 electrically disconnects the measurement land 651 and the power supply circuit 410.

Figure 7:
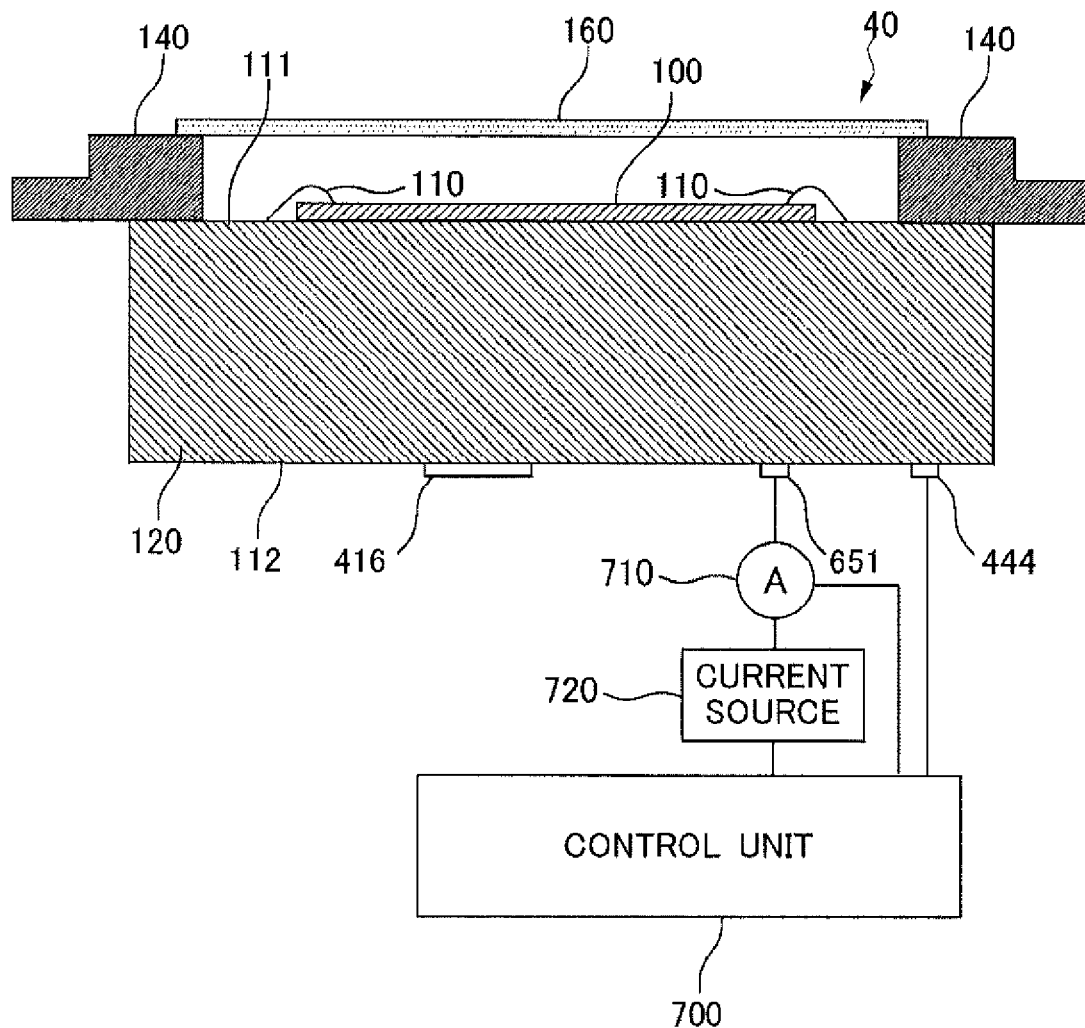
FIG. 7 schematically shows a leakage current measuring system 790.

FIG. 7 schematically shows a leakage current measuring system 790. The leakage current measuring system 790 comprises a control unit 700, a current measuring unit 710, a current source 720 and the image-capturing unit 40.

In order to measure a leakage current of the image-capturing chip 100, the control unit 700 brings about a non-driving state where the image-capturing chip 100 does not operate. Also, the control unit 700 applies a positive voltage to the control land 444. Thereby, the power supply circuit 410 and the image-capturing chip 100 become electrically disconnected. In this state, the control unit 700 controls the current source 720 to bring about a state where an electrical current can be fed from the current source 720 to the image-capturing chip 100 via the measurement land 451, and causes the current measuring unit 710 to measure the current value of an electrical current flowing from the current source 720 into the measurement land 451. The control unit 700 calculates the current value measured by the current measuring unit 710 as the current value of a leakage current.

The control unit 700 performs quality judgment of the image-capturing chip 100 based on the calculated current value of a leakage current. For example, the control unit 700 judges that the image-capturing chip 100 is a non-conforming article when the calculated current value of a leakage current is higher than a predetermined value. The control unit 700 judges that the image-capturing chip 100 is a conforming article when the calculated current value of a leakage current is equal to or lower than a predetermined value.

After measuring the leakage current, the control unit 700 stops application of a positive voltage to the control land 444, and electrically opens the control land 444. Thereby, the power supply circuit 410 and the image-capturing chip 100 are electrically connected, and it becomes possible to feed electrical power from the power supply circuit 410 to the image-capturing chip 100 via the power supply line 400.

As explained with reference to FIG. 4 to FIG. 7, depending on a voltage applied to the control land 444, the FET 440 switches between a state where the power supply circuit 410 and the image-capturing chip 100 are electrically disconnected, and a state where they are electrically connected. The FET 440 is one example of a switch unit that switches between a state where the power supply circuit 410 and the image-capturing chip 100 are electrically disconnected, and a state where the power supply circuit 410 and the image-capturing chip 100 are electrically connected. Also, the control land 444 is one example of an electrode for control for feeding, to the FET 440, electrical signals to control switching operation by the FET 440.

Figure 8:
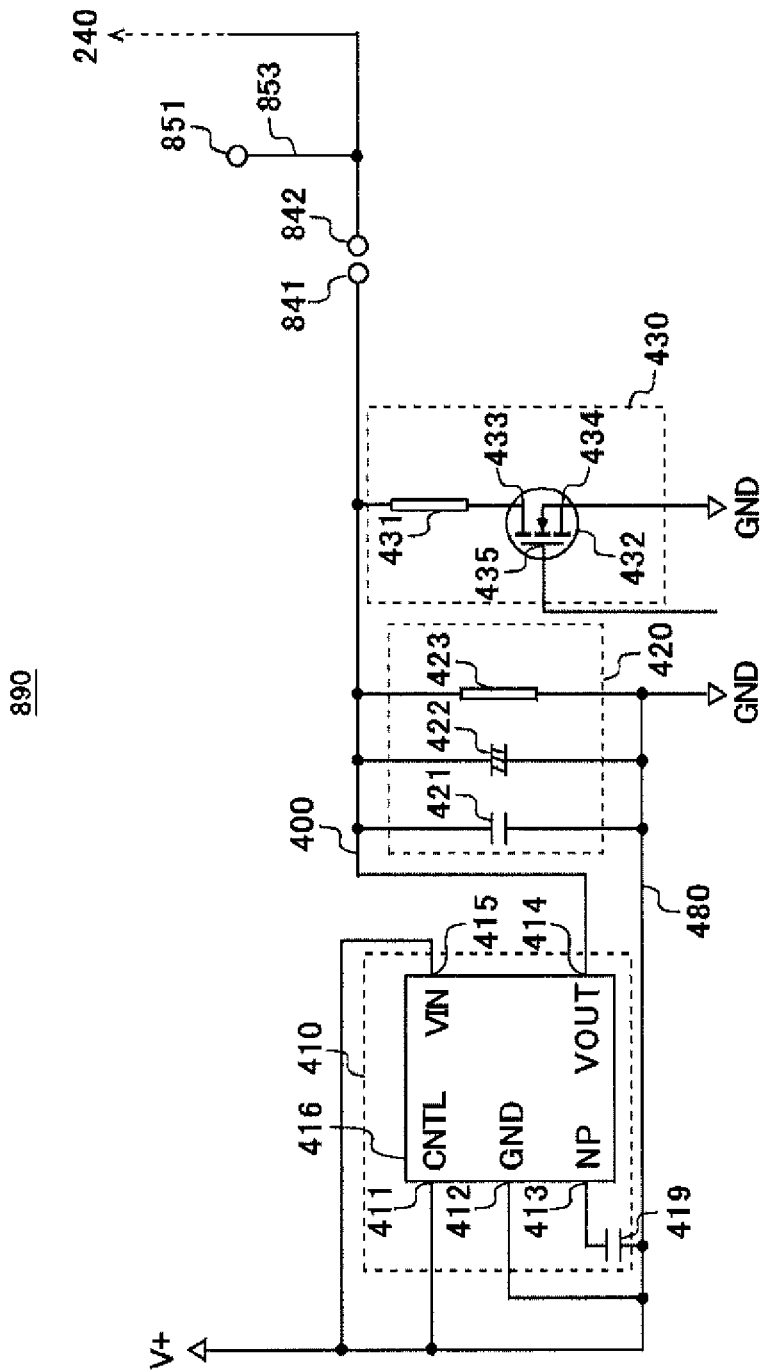
FIG. 8 is a circuit diagram schematically showing an electrical power supply circuit 890 in a third implementation example.

FIG. 8 is a circuit diagram schematically showing an electrical power supply circuit 890 in a third implementation example. Among components that the electrical power supply circuit 890 has, the components that are provided with the same reference numerals as those provided to components that the electrical power supply circuits 490 explained with reference to FIG. 4 and FIG. 5 has have functions and configurations similar to corresponding components that the electrical power supply circuits 490 has. Among components that the electrical power supply circuit 890 has, explanation of the components corresponding to components that the electrical power supply circuit 490 has may be omitted. Among components that the electrical power supply circuit 890 has, only differences of components from the corresponding components that the electrical power supply circuit 490 has may be explained.

The electrical power supply circuit 890 has the power supply line 400, the ground line 480, the power supply circuit 410, the voltage variation suppression circuit 420, the discharge circuit 430, a measurement land 851 and a measurement line 853.

The measurement land 851 corresponds to the measurement land 451. The measurement line 853 corresponds to the measurement line 453. A connection land 841 is provided at a position corresponding to the source terminal 441 of the FET 440. A connection land 842 corresponds to the drain terminal 442 of the FET 440. For this reason, the configuration of the electrical power supply circuit 890 is equivalent to the configuration obtained by excluding the measurement resistor 450, the measurement land 452 and the measurement line 454 from the configuration of the electrical power supply circuit 490, and providing the connection land 841 and the connection land 842 instead of the FET 440, the control line 445, the control land 444 and the pull down resistor 446.

The connection land 841 and the connection land 842 are provided spaced apart from each other. The connection land 841 and the connection land 842 are provided close to each other. The connection land 841 and the connection land 842 are provided separated from each other by a distance that can be connected by solder after implementing the electrical power supply circuit 890 on the implementation substrate 120.

Measurement of a leakage current of the image-capturing chip 100 is performed in a state where the connection land 841 and the connection land 842 are not electrically connected by solder. Measurement of a leakage current of the image-capturing chip 100 is performed by connecting a current source to the measurement land 651. After measuring a leakage current, if the image-capturing chip 100 is determined as a conforming article, the connection land 841 and the connection land 842 are connected by solder. Thereby, a feed line from the output terminal 414 of the regulator 416 to the bonding pad 240 connected to the feed terminal of the image-capturing chip 100 is formed by the power supply line 400, the connection land 841, solder connection between the connection land 841 and the connection land 842 and the connection land 842. That is, the power supply circuit 410 and the image-capturing chip 100 are electrically connected.

Figure 9A:
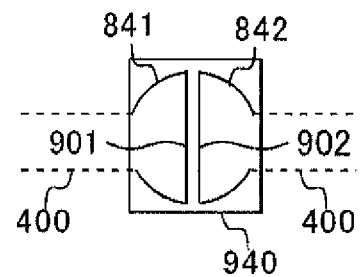
FIG. 9A schematically shows an implementation example of a connection land 841 and a connection land 842.
Figure 9B:
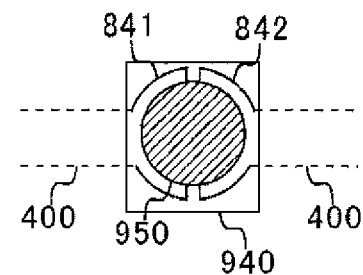
FIG. 9B schematically shows an implementation example of the connection land 841 and the connection land 842.

FIGS. 9A and 9B schematically show an implementation example of the connection land 841 and the connection land 842. FIG. 9A schematically shows a state before measuring a leakage current and at the time of measuring a leakage current. The connection land 841 and the connection land 842 are formed to be exposed through an opening 940 of the solder resist layer 211.

The outer edge of the connection land 841 is approximately semicircular. The outer edge of the connection land 842 is approximately semicircular. A straight line portion 901 at the outer edge of the connection land 841 faces a straight line portion 902 at the outer edge of the connection land 842. The straight line portion 901 at the outer edge of the connection land 841 and the straight line portion 902 at the outer edge of the connection land 842 are formed to be spaced apart from each other. The power supply line 400 extends from the side opposite to the straight line portion 901 at the outer edge of the connection land 841. Also, the power supply line 400 extends from the side opposite to the straight line portion 902 at the outer edge of the connection land 842.

FIG. 9B schematically shows a state where a conductive bridge 950 is formed between the connection land 841 and the connection land 842 after measuring a leakage current. After measuring a leakage current, the conductive bridge 950 is formed between the connection land 841 and the connection land 842 by solder. Thereby, the connection land 841 and the connection land 842 are electrically connected by the conductive bridge 950.

The connection land 842 is one example of an electrode provided, in the power supply line 400, on the power supply circuit 410 side relative to the measurement land 851. The connection land 841 is one example of an electrode that is implemented to be spaced apart from the connection land 842 and is provided between the connection land 842 and the power supply circuit 410 in the power supply line 400. As explained above, a leakage current of the image-capturing chip 100 is measured by using the measurement land 851 in a state where the connection land 841 and the connection land 842 are electrically insulated. The connection land 841 and the connection land 842 are electrically connected by a conductor after measuring the leakage current.

As explained above, in the power supply line 400, the connection land 841 and the connection land 842 are provided on the power supply circuit 410 side relative to the measurement land 851. When measuring a leakage current of the image-capturing chip 100, the measurement land 851 and the power supply circuit 410 are electrically disconnected by the connection land 841 and the connection land 842.

Figure 10A:
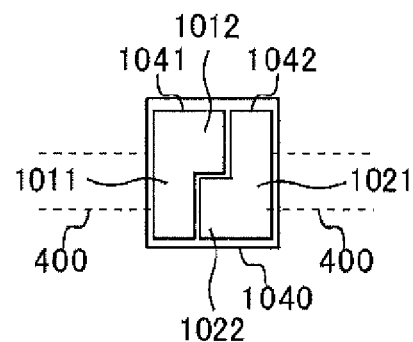
FIG. 10A schematically shows another implementation example of the connection land 841 and the connection land 842.
Figure 10B:
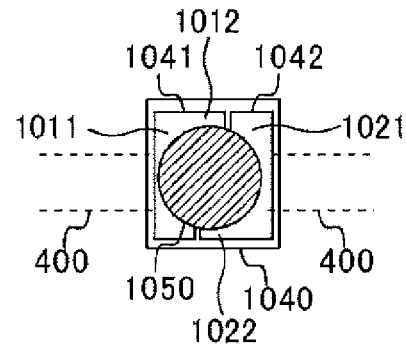
FIG. 10B schematically shows another implementation example of the connection land 841 and the connection land 842.

FIGS. 10A and 10B schematically show another implementation example of the connection land 841 and the connection land 842. A connection land 1041 corresponds to the connection land 841, and a connection land 1042 corresponds to the connection land 842. FIG. 10A schematically shows a state before measuring a leakage current and at the time of measuring a leakage current. The connection land 1041 and the connection land 1042 are formed to be exposed through an opening 1040 of the solder resist layer 211.

The connection land 1041 has a region 1011 that has an edge connected to the power supply line 400, and a protruding portion 1012 that protrudes from the region 1011 toward the connection land 1042.

The connection land 1042 has a region 1021 that has an edge connected to the power supply line 400, and a protruding portion 1022 that protrudes from the region 1021 toward the connection land 1041.

The protruding portion 1012 of the connection land 1041 and the region 1021 of the connection land 1042 have edge portions that face each other. The edge portions at which the protruding portion 1012 and the region 1021 face each other are approximately perpendicular to the direction in which the power supply line 400 extends. Also, the protruding portion 1022 of the connection land 1042 and the region 1011 of the connection land 1041 have edge portions that face each other. The edge portions at which the protruding portion 1022 and the region 1011 face each other are approximately perpendicular to the direction in which the power supply line 400 extends.

Also, the protruding portion 1012 of the connection land 1041 and the protruding portion 1022 of the connection land 1042 have edge portions that face each other. The edge portions at which the protruding portion 1012 and the protruding portion 1022 face each other are approximately parallel to the direction in which the power supply line 400 extends. Thereby, the lengths of the edge portions at which the connection land 1041 and the connection land 1042 face each other can be made long.

FIG. 10B schematically shows a state where a conductive bridge 1050 is formed between the connection land 1041 and the connection land 1042 after measuring a leakage current. After measuring a leakage current, the conductive bridge 1050 is formed between the connection land 1041 and the connection land 1042 by solder. Thereby, the connection land 1041 and the connection land 1042 are electrically connected by the conductive bridge 1050.

The connection land 1042 is one example of an electrode provided, in the power supply line 400, on the power supply circuit 410 side relative to the measurement land 851. The connection land 1041 is one example of an electrode that is implemented to be spaced apart from the connection land 1042 and is provided between the connection land 1042 and the power supply circuit 410 in the power supply line 400. As explained above, a leakage current of the image-capturing chip 100 is measured by using the measurement land 851 in a state where the connection land 1041 and the connection land 1042 are electrically insulated. The connection land 1041 and the connection land 1042 are electrically connected by a conductor after measuring the leakage current.

As explained above, in the power supply line 400, the connection land 1041 and the connection land 1042 are provided on the power supply circuit 410 side relative to the measurement land 851. When measuring a leakage current of the image-capturing chip 100, the measurement land 851 and the power supply circuit 410 are electrically disconnected by the connection land 1041 and the connection land 1042.

Figure 11:
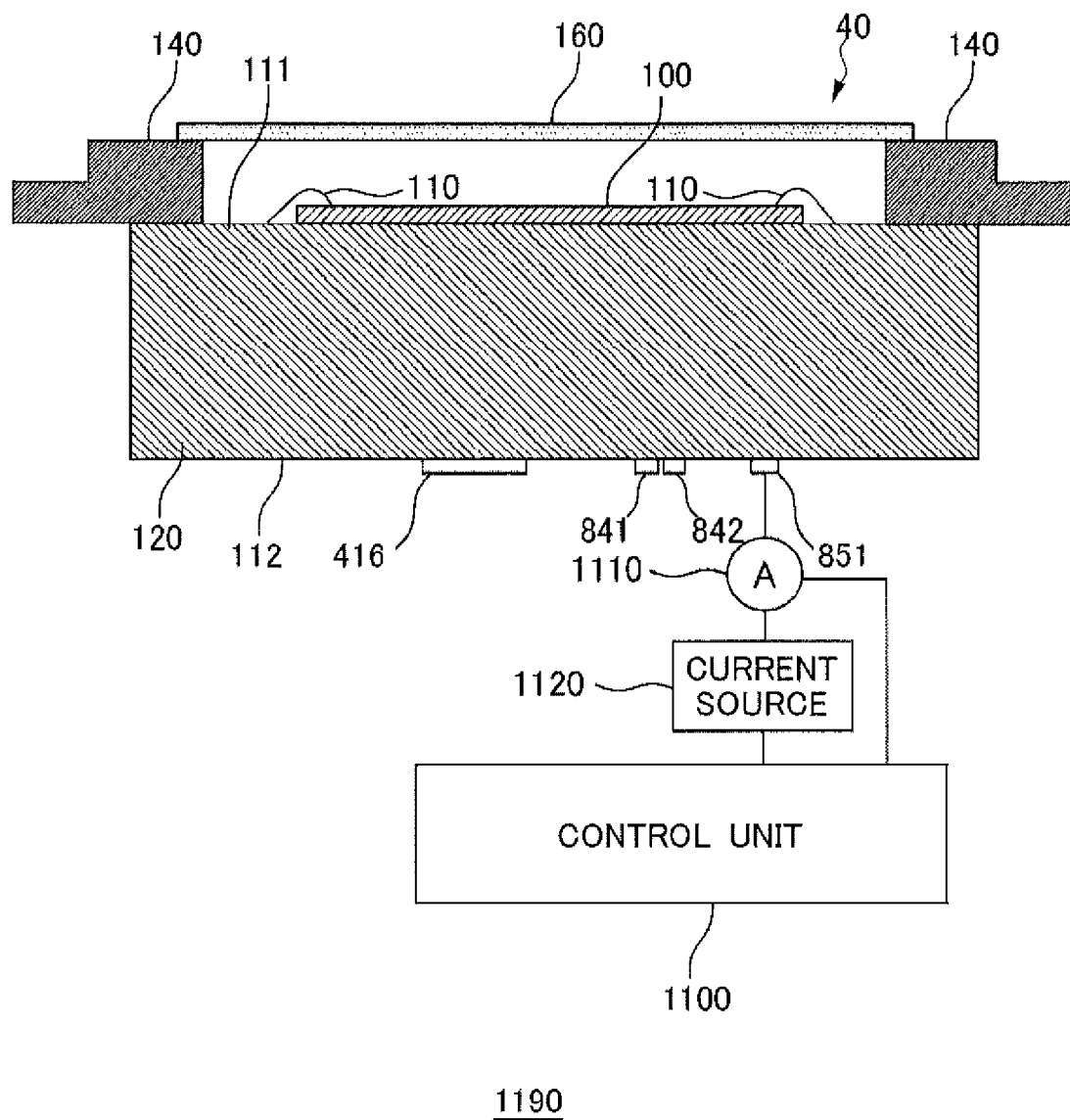
FIG. 11 schematically shows a leakage current measuring system 1190 according to the third implementation example.

FIG. 11 schematically shows a leakage current measuring system 1190 according to the third implementation example. The leakage current measuring system 1190 comprises a control unit 1100, a current measuring unit 1110, a current source 1120 and the image-capturing unit 40. Here, operation of the leakage current measuring system 1190 is explained by using the implementation example of the connection land 841 and the connection land 842 that is explained with reference to FIGS. 9A and 9B or the like.

In order to measure a leakage current of the image-capturing chip 100, the control unit 1100 brings about a non-driving state where the image-capturing chip 100 does not operate. Also, in a state where the connection land 841 and the connection land 842 are not electrically connected, the control unit 1100 controls the current source 1120 to bring about a state where an electrical current can be fed from the current source 1120 to the image-capturing chip 100 via the measurement land 851, and causes the current measuring unit 1110 to measure the current value of an electrical current flowing from the current source 1120 into the measurement land 851. The control unit 1100 calculates the current value measured by the current measuring unit 1110 as the current value of a leakage current.

The control unit 1100 performs quality judgment of the image-capturing chip 100 based on the calculated current value of a leakage current. For example, the control unit 1100 judges that the image-capturing chip 100 is a non-conforming article when the calculated current value of a leakage current is higher than a predetermined value. The control unit 1100 judges that the image-capturing chip 100 is a conforming article when the calculated current value of a leakage current is equal to or lower than a predetermined value.

After measuring the leakage current, the conductive bridge 950 is formed between the connection land 841 and the connection land 842 to connect the connection land 841 and the connection land 842. Thereby, the power supply circuit 410 and the image-capturing chip 100 are electrically connected, and it becomes possible to feed electrical power from the power supply circuit 410 to the image-capturing chip 100 via the power supply line 400.

Operation similar to the operation of the leakage current measuring system 1190 explained with reference to FIG. 11 can be applied to the implementation example of the connection land 1041 and the connection land 1042 explained with reference to FIGS. 10A and 10B, etc. For this reason, detailed explanation about the leakage current measuring system according to the implementation example of the connection land 1041 and the connection land 1042 is omitted.

As explained with reference to FIG. 4 to FIG. 7, when a leakage current of the image-capturing chip 100 is measured, the FET 440 functions as a disconnecting unit that is electrically disconnecting the power supply circuit 410 and the image-capturing chip 100. Also, the measurement land 451, the measurement land 651 and the measurement land 851 are implemented on the implementation substrate 120 in a state where they are electrically connected to the power supply line 400, and are used for measuring a leakage current of the image-capturing chip 100.

In the explanation of the embodiments explained above, the control land 444, the measurement land 451, the measurement land 452, the connection land 841, the connection land 842, the connection land 1041 and the connection land 1042 are examples of electrodes that can be accessed from the outside after implementing the image-capturing unit 40. The control land 444, the measurement land 451, the measurement land 452, the connection land 841, the connection land 842, the connection land 1041 and the connection land 1042 are not limited to lands, but can be applied to various implementation forms.

The camera 10 including the lens unit 20 and the camera body 30 is explained as one example of an image-capturing apparatus. However, the image-capturing apparatus does not have to include the lens unit 20. For example, the camera body 30 is one example of an image-capturing apparatus. Also, the image-capturing apparatus is a concept including a lens-non-replaceable image-capturing apparatus, other than a lens-replaceable image-capturing apparatus such as a single-lens reflex camera.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCE SYMBOLS

10: camera; 20: lens unit; 22: optical axis; 24: lens mount; 26: body mount; 30: camera body; 31: mirror unit; 32:

main mirror; 33: sub mirror; 38: shutter unit; 40: image-capturing unit; 51: MPU; 52: ASIC; 60: mirror box; 62: substrate; 70: imaging optical system; 72: focus detection sensor; 80: focus plate; 82: pentaprism; 84: finder optical system; 86: finder window; 88: display unit; 100: image-capturing chip; 101: image-capturing region; 102: peripheral region; 110: wire 111: first main surface; 112: second main surface; 120: implementation substrate; 121: first layer; 122: second layer; 131: via; 132: insulator; 138: opening portion; 140: frame; 141: first surface; 142: second surface; 143: third surface; 144: fourth surface; 145: fifth surface; 146: sixth surface; 147: positioning hole; 148: mount hole; 149: screw; 150: bracket; 160: cover glass; 180: electronic component; 201, 211: solder resist layer; 202, 204, 212, 214: wiring layer; 203, 205, 213, 215: insulation layer; 207: core layer; 210, 220, 230: adhering portion; 240: bonding pad; 400: power supply line; 410: power supply circuit; 411: control terminal; 412: GND terminal; 413: noise pass pin; 414: output terminal; 415: input terminal; 416: regulator; 419: capacitor; 420: voltage variation suppression circuit; 421: first capacitor; 422: second capacitor; 423: resistor; 430: discharge circuit; 431: resistor; 432: FET; 433: drain terminal; 434: source terminal; 435: gate terminal; 440: FET; 441: source terminal; 442: drain terminal; 443: gate terminal; 444: control land; 445: control line; 446: pull down resistor; 450: measurement resistor; 451: measurement land; 452: measurement land; 453: measurement line; 454: measurement line; 480: ground line; 490: electrical power supply circuit

What is claimed is:

1. An image-capturing unit comprising:
   an image-capturing chip that includes a photoelectric converter that converts light to electrical charges;
   an electronic component for feeding electrical power for driving the image-capturing chip;
   wiring to which the electrical power fed to the image-capturing chip from the electronic component is outputted;
   an adjusting unit that is provided to the wiring, and adjusts an electrical current flowing from the electronic component to the image-capturing chip so that the electrical current becomes smaller when a leakage current of the image-capturing chip is being measured, as compared to when the leakage current of the image-capturing chip is not being measured; and
   a substrate that has a first surface on which the image-capturing chip is arranged and a second surface, opposite the first surface, on which the electronic component, the wiring, and the adjusting unit are arranged.

2. The image-capturing unit according to claim 1, wherein the image-capturing chip is arranged in a space formed by a frame, arranged on the first surface, that surrounds at least a portion of the image-capturing chip and a light-transmissive substrate arranged to face the image-capturing chip.

3. The image-capturing unit according to claim 1, further comprising a first electrode that is connected to the wiring and is used when the leakage current of the image-capturing chip is being measured, wherein
   in the wiring, the adjusting unit is provided on a side of the electronic component relative to the first electrode.

4. The image-capturing unit according to claim 3, further comprising:
   a resistor that is provided to the wiring and is connected in parallel with the adjusting unit; and
   a second electrode that is connected to the wiring and is used when the leakage current of the image-capturing chip is being measured, wherein
   the first electrode is electrically connected to a first end portion of the resistor, and
   the second electrode is electrically connected to a second end portion of the resistor.

5. The image-capturing unit according to claim 1, wherein the adjusting unit makes higher an electrical resistance between the electronic component and the image-capturing chip when the leakage current of the image-capturing chip is being measured, as compared to when the leakage current of the image-capturing chip is not being measured.

6. The image-capturing unit according to claim 1, wherein the electronic component has a power supply circuit that outputs electrical power fed to the image-capturing chip.

7. The image-capturing unit according to claim 6, wherein the electronic component has a voltage variation suppression circuit that suppresses temporal variation in voltage output by the power supply circuit.

8. The image-capturing unit according to claim 6, wherein the electronic component has a discharge circuit that discharges electrical charges accumulated in the image-capturing chip.

9. An image-capturing apparatus comprising the image-capturing unit according to claim 1.

10. An image-capturing unit comprising:
    an image-capturing chip that includes a photoelectric converter that converts light to electrical charges;
    a power supply circuit that outputs electrical power to be fed to the image-capturing chip;
    a wiring that feeds the electrical power from the power supply circuit to the image-capturing chip;
    a restricting unit, provided to the wiring, that restricts an electrical current flowing from the power supply circuit to the image-capturing chip when a leakage current of the image-capturing chip is measured; and
    a substrate that has a first surface on which the image-capturing chip is arranged and a second surface, opposite the first surface, on which the power supply circuit, the wiring, and the restricting unit are arranged.

11. The image-capturing unit according to claim 10, wherein
    the image-capturing chip is arranged in a space formed by a frame, arranged on the first surface, that surrounds at least a portion of the image-capturing chip and a light-transmissive substrate arranged to face the image-capturing chip.

12. The image-capturing unit according to claim 10, further comprising a first electrode that is connected to the wiring and is used when the leakage current of the image-capturing chip is being measured, wherein
    in the wiring, the restricting unit is provided on a side of the electronic component relative to the first electrode.

13. The image-capturing unit according to claim 12, further comprising:
    a resistor that is provided to the wiring and is connected in parallel with the restricting unit; and
    a second electrode that is connected to the wiring and is used when the leakage current of the image-capturing chip is being measured, wherein
    the first electrode is electrically connected to a first end portion of the resistor, and
    the second electrode is electrically connected to a second end portion of the resistor.

14. The image-capturing unit according to claim 10, wherein the restricting unit makes higher an electrical resistance between the power supply circuit and the image-capturing chip when the leakage current of the image-capturing chip is being measured, as compared to when the leakage current of the image-capturing chip is not being measured.

15. The image-capturing unit according to claim 10, wherein the power supply circuit further includes a voltage variation suppression circuit that suppresses temporal variation in voltage output by the power supply circuit.

16. The image-capturing unit according to claim 10, wherein the power supply circuit further includes a discharge circuit that discharges electrical charges accumulated in the image-capturing chip.

17. An image-capturing apparatus comprising the image-capturing unit according to claim 10.

18. A substrate comprising:
   a first surface on which an image-capturing chip is mounted; and
   a second surface, opposite the first surface, that is provided with:
      (i) an electronic component for feeding electrical power for driving the image-capturing chip;
      (ii) wiring to which the electrical power fed to the image-capturing chip from the electronic component is outputted; and
      (iii) a unit, provided to the wiring, that (a) adjusts an electrical current flowing from the electronic component to the image-capturing chip so that the electrical current becomes smaller when a leakage current of the image-capturing chip is being measured, as compared to when the leakage current of the image-capturing chip is not being measured, or (b) restricts the electrical current.

19. The image-capturing unit according to claim 1, wherein:
   the image-capturing chip includes an image-capturing area in which a plurality of the photoelectric converters is arranged, and
   the electronic component is arranged opposite to the image-capturing area on the second surface.

20. The image-capturing unit according to claim 10, wherein:
   the image-capturing chip includes an image-capturing area in which a plurality of the photoelectric converters is arranged, and
   the power supply circuit unit is arranged opposite to the image-capturing area on the second surface.

21. The image-capturing unit according to claim 1, wherein
   the substrate includes signal wiring to which a signal from the image-capturing chip is outputted, the signal wiring being connected to the image-capturing chip.

22. The image-capturing unit according to claim 21, further comprising:
   a connector that is arranged on the second surface and transmits the signal outputted to the signal wiring to an external electronic circuit.

23. The image-capturing unit according to claim 1, wherein the adjusting unit is a field-effect transistor.

* * * * *